United States Patent
Chen et al.

(10) Patent No.: US 12,301,097 B2
(45) Date of Patent: May 13, 2025

(54) FAULT PREDICTION METHOD AND APPARATUS FOR POWER CONVERSION DEVICE, AND POWER CONVERSION SYSTEM

(71) Applicant: China Electronic Product Reliability and Environmental Testing Research Institute ((The fifth electronic research institute of Ministry of Industry and Information Technology) (CEPREI Labratory)), Guangdong (CN)

(72) Inventors: Yiqiang Chen, Guangdong (CN); Yihang Lin, Guangdong (CN); Bo Hou, Guangdong (CN); Dazhi Wang, Guangdong (CN); Shuo Zhang, Guangdong (CN); Xiangzhen Cai, Guangdong (CN)

(73) Assignee: China Electronic Product Reliability and Environmental Testing Research Institute ((The fifth electronic research institute of Ministry of Industry and Information Technology) (CEPREI Laboratory)) (CN)

( * ) Notice: Subject to any disclaimer, the term of this patent is extended or adjusted under 35 U.S.C. 154(b) by 311 days.

(21) Appl. No.: 18/151,837

(22) Filed: Jan. 9, 2023

(65) Prior Publication Data

US 2024/0055976 A1 Feb. 15, 2024

(30) Foreign Application Priority Data

Aug. 10, 2022 (CN) .......................... 202210954434.X

(51) Int. Cl.
*H02M 1/32* (2007.01)
*G01R 15/18* (2006.01)
(Continued)

(52) U.S. Cl.
CPC ............ *H02M 1/32* (2013.01); *G01R 15/181* (2013.01); *H02M 7/4815* (2021.05); *H02M 7/5387* (2013.01)

(58) Field of Classification Search
CPC .... H02M 1/32; H02M 7/4815; H02M 7/5387; G01R 15/181
See application file for complete search history.

(56) References Cited

U.S. PATENT DOCUMENTS

2020/0274437 A1* 8/2020 Deguchi ................. H02M 1/32
2021/0231744 A1* 7/2021 Khan ...................... H02M 1/32
(Continued)

*Primary Examiner* — Kyle J Moody
*Assistant Examiner* — Lakaisha Jackson
(74) *Attorney, Agent, or Firm* — Lerner David LLP

(57) ABSTRACT

Disclosed are a fault prediction method and apparatus for a power conversion device, and a power conversion system. The method includes: acquiring multiple output voltages of a detecting coil in a preset time period, wherein an electromagnetic induction is generated between the detecting coil and a switching-on circuit of a switching transistor in the power conversion device; extracting each output frequency corresponding to each output voltage of the detecting coil; predicting time when the power conversion device fails according to a change trend of each output frequency. The apparatus includes a detecting coil and a data processing device; the detecting coil is connected to the data processing device and is a closed coil; the data processing device is configured to: acquire an output voltage of the detecting coil, extract corresponding output frequency, and predict time when the power conversion device fails according to a change trend of each output frequency.

10 Claims, 5 Drawing Sheets

(51) Int. Cl.
*H02M 7/48* (2007.01)
*H02M 7/5387* (2007.01)

(56) References Cited

U.S. PATENT DOCUMENTS

2022/0062620 A1* 3/2022 Roe .................... H02J 50/80
2022/0373588 A1* 11/2022 Maki ................... H02P 29/024

* cited by examiner

FAULT PREDICTION METHOD AND APPARATUS FOR POWER CONVERSION DEVICE, AND POWER CONVERSION SYSTEM

CROSS REFERENCE TO RELATED APPLICATION

The present application claims priority to Chinese Patent Application with No. 202210954434.X, entitled "Fault Prediction Method and Apparatus for Power Conversion Device, and Power Conversion System", and filed on Aug. 10, 2022, the content of which is expressly incorporated herein by reference in its entirety.

TECHNICAL FIELD

The present disclosure relates to the field of fault prediction technology, and particularly to a fault prediction method and apparatus for a power conversion device, and a power conversion system.

BACKGROUND

With the continuous development of the microelectronic technology, the degrees of informatization, intelligence and electrification of modern device have been continuously improved. As the core device of the modern device, power conversion device such as DC/AC inverters and DC/DC power supplies, etc., have been widely used. The reliability of the power conversion device is an important guarantee for the working performance of the modern device. In power conversion device, the performance degradation of the electronic component is the root cause of affecting the reliability of the power conversion device.

The conventional method for detecting an electronic component is to use the sensors such as current transformers, Hall sensors and the like to monitor the current and voltage signals of the power electronic device in the power conversion device on-line, and then fault information of the circuit, module or system of the power conversion device is obtained. However, in such method, only the real-time detected data can be utilized to determine whether there is a fault at present, and to detect the existing fault, so that the conventional method for detecting the electronic component is unreliable.

SUMMARY

In view of the above, as for the above technical problem, it is necessary to provide a fault prediction method and apparatus for predicting the degradation of the power conversion device.

In the first aspect, a fault prediction method for a power conversion device is provided, including:
    acquiring multiple output voltages of a detecting coil in a preset time period, wherein an electromagnetic induction is generated between the detecting coil and a switching-on circuit of a switching transistor in the power conversion device;
    extracting each output frequency corresponding to each output voltage of the detecting coil;
    predicting time when the power conversion device fails according to a change trend of each output frequency.

In an embodiment, the predicting the time when the power conversion device fails according to the change trend of each output frequency includes:
    predicting the time when the power conversion device fails according to a change law of a difference value between each output frequency and a reference frequency.

In an embodiment, the extracting each output frequency corresponding to each output voltage of the detecting coil includes:
    obtaining an oscillation period of each output voltage according to each output voltage of the detecting coil;
    obtaining a frequency of each output voltage according to the oscillation period of each output voltage.

In the second aspect, a fault prediction apparatus for a power conversion device is provided, including a detecting coil and a data processing device, in which the detecting coil is connected to the data processing device, the detecting coil is a closed coil, and an electromagnetic induction is generated between the detecting coil and a switching-on circuit of a switching transistor in the power conversion device;
    the data processing device is configured to: acquire multiple output voltages of the detecting coil in a preset time period, extract each output frequency corresponding to each output voltage of the detecting coil, and predict time when the power conversion device fails according to a change trend of each output frequency.

In an embodiment, the detecting coil is symmetric with respect to the switching-on circuit of the switching transistor to be detected.

In an embodiment, the number of detecting coils is equal to the number of switching transistors to be detected, and each detecting coil is configured to detect a corresponding switching transistor to be detected.

In an embodiment, the fault prediction apparatus for the power conversion device further includes a package housing, the detecting coil is provided within the package housing.

In an embodiment, the detecting coil is a Rogowski coil.

In the third aspect, a power conversion system is provided, including a power conversion device and the above-mentioned fault prediction apparatus for the power conversion device.

In an embodiment, the switching transistor in the power conversion device is a power switching device, the detecting coil is configured to detect a current transient characteristic of the switching transistor, and an electromagnetic induction is generated between the detecting coil and the switching-on circuit of the switching transistor, and an induced voltage is generated.

In the above-mentioned fault prediction method and apparatus for the power conversion device, and the power conversion system, the fault prediction method for the power conversion device includes: multiple output voltages of a detecting coil are acquired in a preset time period, an electromagnetic induction is generated between the detecting coil and a switching-on circuit of a switching transistor in the power conversion device; each output frequency corresponding to each output voltage of the detecting coil is extracted; and time when the power conversion device fails is predicted according to a change trend of each output frequency. Based on the electromagnetic induction generated between the detecting coil and the switching-on circuit of the switching transistor in the power conversion device, the multiple output voltages of the detecting coil are acquired in a preset time period, each output frequency corresponding to each output voltage is extracted, the change trend of the output frequency is analyzed, and the time when the power conversion device fails is predicted, thereby implementing the fault prediction of the power conversion device and improving the operation reliability of the power conversion device.

BRIEF DESCRIPTION OF THE DRAWINGS

In order to illustrate more clearly the technical solution in the embodiments of the present disclosure or the conventional technique, the accompanying drawings required to describe the embodiments or the conventional technique are briefly described below. Obviously, the drawings used in the description below are merely some embodiments of the present disclosure, and other drawings can be obtained by those skilled in the art according to these drawings without creative labor.

DETAILED DESCRIPTION

In order to facilitate the understanding of the present disclosure, a more comprehensive description of the disclosure is set forth below with reference to the related accompanying drawings which provide embodiments of the present disclosure. However, the present disclosure can be implemented in many different forms and is not limited to the embodiments described herein. Rather, these embodiments are provided for the purpose of making the disclosure more thorough and comprehensive.

Unless otherwise defined, all technical and scientific terms used herein have the same meanings as would normally be understood by those skilled in the art of the present disclosure. The terms used herein in the specification of the disclosure are merely used for the purpose of describing specific embodiments and are not intended to limit the present disclosure.

The prediction method, device and system for the power conversion device provided in the present disclosure predict the fault of the power conversion device.

Figure 1:
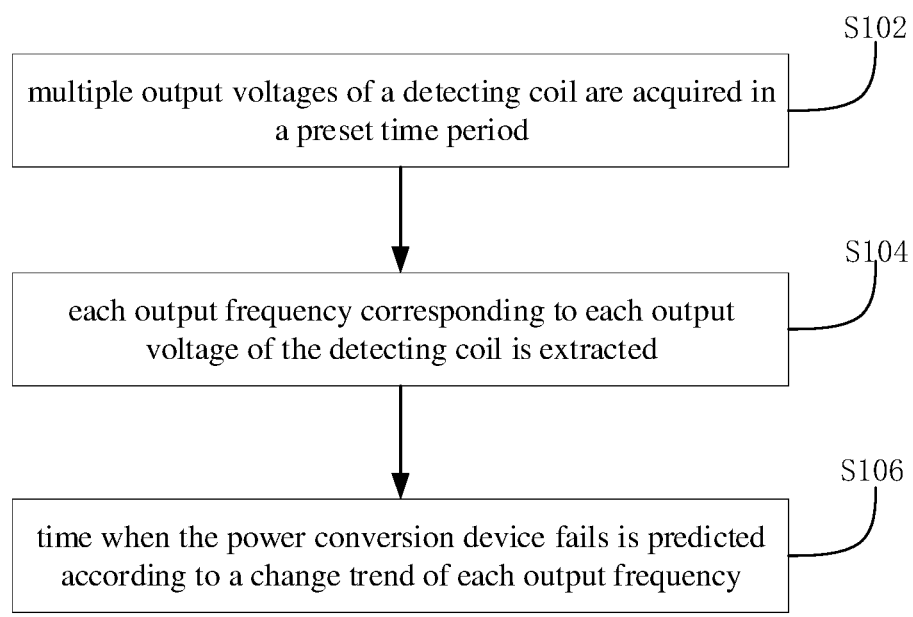
FIG. 1 is a flow chart showing a fault prediction method for a power conversion device according to an embodiment of the present disclosure.

In an embodiment, as shown in FIG. 1, a fault prediction method for a power conversion device is provided, which may be performed by a data processing device. Specifically, the data processing device can be a data processing device originally arranged in the power conversion device and added with a corresponding function based on the original data processing device, thereby saving hardware costs. Alternatively, the data processing device can be another designed data processing device with a corresponding function to ensure the accuracy of the predicted result. The fault prediction method for the power conversion device is utilized to predict the fault of the power conversion device. Specifically, the power conversion device is a device that converts electrical energy from one form to another. The form of the electrical energy can be changed from direct current (DC) energy to alternating current (AC) energy, or from AC energy to DC energy; alternatively, one voltage value is changed to another for the DC energy or AC energy. For example, a DC/DC power supply is a power conversion device that can convert one DC voltage into another fixed or adjustable DC voltage. The fault prediction method for the power conversion device includes following steps.

Step 102: multiple output voltages of a detecting coil are acquired in a preset time period.

An electromagnetic induction is generated between the detecting coil and the switching-on circuit of the switching transistor in the power conversion device.

In a preset time period, i.e., during a period of time, the data processing device continuously acquires an induced voltage of the detecting coil to monitor the power conversion device more comprehensively. For example, during a month, the output voltage of the detecting coil is continuously obtained daily. Alternatively, the output voltage of the detecting coil is obtained discretely at intervals to reduce the workload of the fault prediction of the power conversion device. For example, the induced voltage of the detecting coil is obtained every other month.

The switching transistor is a power device that implements the switching on and off of the circuit, and includes a triode, a field-effect transistor, etc. The power conversion device can control a time ratio of the switching on and the switching off of the switching transistor through the circuit, such that the switching transistor performs a pulse modulation on the input voltage, to implement the change in the form of the electrical energy. The mode in which the power conversion device controls the switching on and off of the switching transistor through the circuit can be a mode of controlling the voltage of one pole of the switching transistor. For example, when the switching transistor in the power conversion device is an enhanced field-effect transistor, there is no current flow between a source and a drain in the absence of voltage at a gate, at this moment the enhanced field-effect transistor is in a switching-off state. When a forward voltage is applied to the gate, the current from the drain to the source can be formed after the forward voltage exceeds a threshold, at this moment the enhanced field-effect transistor is in the switching-on state.

The switching-on circuit of the switching transistor is a circuit in which the current flows from one pole of the switching transistor to the other pole of the switching transistor. For example, when the switching transistor is a field-effect transistor, the switching-on circuit may be a circuit in which the current flows from the drain to the source or from the source to the drain.

The electromagnetic induction is generated between the detecting coil and the switching-on circuit of the switching transistor in the power conversion device. The switching transistor is usually welded on a circuit board of the power conversion device. In order to generate the electromagnetic induction between the detecting coil and the switching-on circuit of the switching transistor in the power conversion device, the detecting coil can be designed and embedded in the circuit board. The switching transistor is in the on or off state under the control of other devices in the power conversion device. In this process, the switching-on circuit of the switching transistor may generate a transient current which can generate a magnetic field around the switching-on circuit. Meanwhile, the detecting coil is located within the magnetic field generated by the transient current, so that the detecting coil can generate the induced voltage. An oscillation frequency of the induced voltage is the same as that of the transient current. Accordingly, the oscillation frequency of the current in the switching-on circuit of the switching transistor can be obtained according to the oscillation frequency of the induced voltage of the detecting coil.

Step 104: each output frequency corresponding to each output voltage of the detecting coil is extracted.

Different output voltages are obtained at different time, and each output voltage corresponds to a frequency. According to some parameters in the voltage data, the corresponding frequency can be obtained. Before each output frequency corresponding to each output voltage of the detecting coil is acquired, the method further includes the measurement of the output voltage. Specifically, an oscilloscope can be utilized to display the waveform of the output voltage. The oscilloscope is a measuring instrument which can observe a waveform curve of amplitudes of different signals varying with time. In addition, the oscilloscope can also be utilized to measure various electric quantities, including the voltage, current, frequency, phase difference, etc.

Step 106: time when the power conversion device fails is predicted according to a change trend of each output frequency.

The frequency is a characteristic parameter indicating the fault situation of the power conversion device. The change trend of each output frequency refers to the change trend of each output frequency with time; and a curve graph of the output frequency with time can further be obtained. Accordingly, the time the power conversion device fails can be predicted according to the curve graph.

Figure 2:
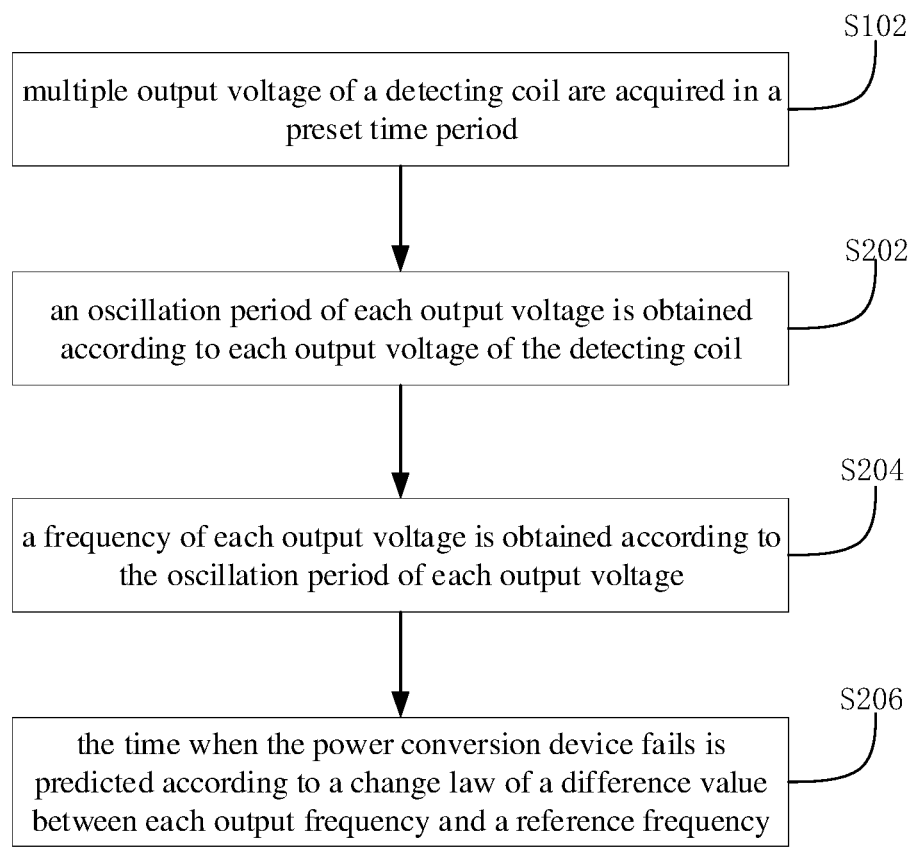
FIG. 2 is a flow chart showing a fault prediction method for a power conversion device according to another embodiment of the present disclosure.

In an embodiment, as shown in FIG. 2, the step 106 includes a step 206.

Step 206: the time when the power conversion device fails is predicted according to a change law of a difference value between each output frequency and a reference frequency.

The reference frequency is a frequency obtained from a reference voltage. The reference voltage can be an output voltage of the switching transistor in the power conversion device at the factory when the switching transistor is detected by the detecting coil, to represent a standard operating state of the switching transistor. Alternatively, the reference voltage can also be an output voltage of the switching transistor in the power conversion device when the switching transistor is detected by the detecting coil after the switching transistor in the power conversion device works for a period of time and before the fault of the switching transistor in the power conversion device is predicted, so that a service state of the switching transistor is combined to enable the reference voltage to be more in line with the actual operating characteristics of the switching transistor.

The step of predicting the time when the power conversion device fails according to the change law of the difference value between each output frequency and the reference frequency may include: when the difference value between each output frequency and the reference frequency is larger, a deviation of each output frequency from the reference frequency is considered to be larger, and the power conversion device is predicted to fail quickly; when the difference value between each output frequency and the reference frequency is smaller, the deviation of each output frequency from the reference frequency is considered to be smaller, the power conversion device is predicted to fail for some time. The difference value between each output frequency and the reference frequency can be a ratio of the output frequency to the reference frequency, or the difference value between the output frequency and the reference frequency. For example, when the ratio of the output frequency to the reference frequency or the difference value between the output frequency and the reference frequency exceeds a certain value or a range, the power conversion device is predicted to fail after a period of time. By using the frequency to represent the fault situation of the power conversion device, the accuracy in predicting the time when the fault occurs can be improved.

Optionally, in an embodiment, the time when the power conversion device fails is predicted according to a change law of a difference value between each output voltage and the reference voltage. The reference voltage can be an output voltage of the switching transistor in the power conversion device at the factory when the switching transistor is detected by the detecting coil, to represent the standard operating state of the switching transistor. Alternatively, the reference voltage can also be an output voltage of the switching transistor in the power conversion device when the switching transistor is detected by the detecting coil after the switching transistor in the power conversion device works for a period of time and before the fault of the switching transistor in the power conversion device is predicted, so that a service state of the switching transistor is combined to enable the reference voltage to be more in line with the actual operating characteristics of the switching transistor.

The step of predicting the time when the power conversion device fails according to the change law of the difference value between each output voltage and the reference voltage may include: when the difference value between each output voltage and the reference voltage is larger, a deviation of each output voltage from the reference voltage is considered to be larger, and the power conversion device is predicted to fail quickly; when the difference value between each output voltage and the reference voltage is smaller, the deviation of each output voltage from the reference voltage is considered to be smaller, the power conversion device is predicted to fail for some time. The difference value between each output voltage and the reference voltage can be a ratio of the output voltage to the reference voltage, or the difference value between the output voltage and the reference voltage. For example, when the ratio of the output voltage to the reference voltage or the difference value between the output voltage and the reference voltage exceeds a certain value or a range, the power conversion device is predicted to fail after a period of time. By using the output voltage to represent the fault situation of the power conversion device, the output voltage can be simply measured by a relevant device, so that the process of the fault prediction is much simpler and more convenient.

In an embodiment, as shown in FIG. 2, the step 104 includes following step 202 and step 204.

Step 202: an oscillation period of each output voltage is obtained according to each output voltage of the detecting coil.

Each output voltage changing with time can show a certain change law, and the oscillation period of each output voltage can be obtained according to the change law. For example, the relation of each output voltage with time can be approximated as a sinusoidal waveform, and the sinusoidal waveform has a certain periodicity, so that the oscillation period of each output voltage can be obtained by the period of the sinusoidal waveform. When the waveform of the output voltage is observed, an oscilloscope can be used, and the oscillation period of the output voltage can be read directly through the oscilloscope.

Step 204: a frequency of each output voltage is obtained according to the oscillation period of each output voltage.

The frequency corresponding to each output voltage can be obtained by calculating an inverse of the oscillation period of each output voltage.

It should be appreciated that although the steps in the flow charts of the embodiments described above are displayed in an order indicated by the arrows, these steps are not definitely performed in the order indicated by the arrows. Unless explicitly stated in this article, these steps are not strictly sequential, but can be executed in another order. Moreover, at least a portion of the steps in the flow charts of the embodiments described above may include multiple steps or phases that are not definitely performed at the same time, but may be performed at different time; and the order in which the steps or phases are performed may not definitely be performed in sequence, but may be performed in turns or alternatively with other steps or phases or at least a portion of steps or phases in other steps.

The above-mentioned fault prediction method for the power conversion device includes: the multiple output voltages of the detecting coil are acquired in a preset time period, in which the electromagnetic induction is generated between the detecting coil and the switching-on circuit of the switching transistor in the power conversion device; each output frequency corresponding to each output voltage of the detecting coil is extracted; the time when the power conversion device fails is predicted according to the change trend of each output frequency. Accordingly, the fault prediction of the power conversion device is implemented, and the operation reliability of the power conversion device is improved.

Based on the same inventive concept, in an embodiment of the present disclosure, a fault prediction apparatus for a power conversion device is provided, which can implement the fault prediction method for the power conversion device according to the above. The solution provided by the apparatus is similar to the solution described in the above method. Therefore, as for the specific definitions in one or more embodiments of the fault prediction apparatus for the power conversion device provided below, reference can be made to the definitions on the fault prediction method for the power conversion device in the above, which will not be repeated here.

Figure 3:
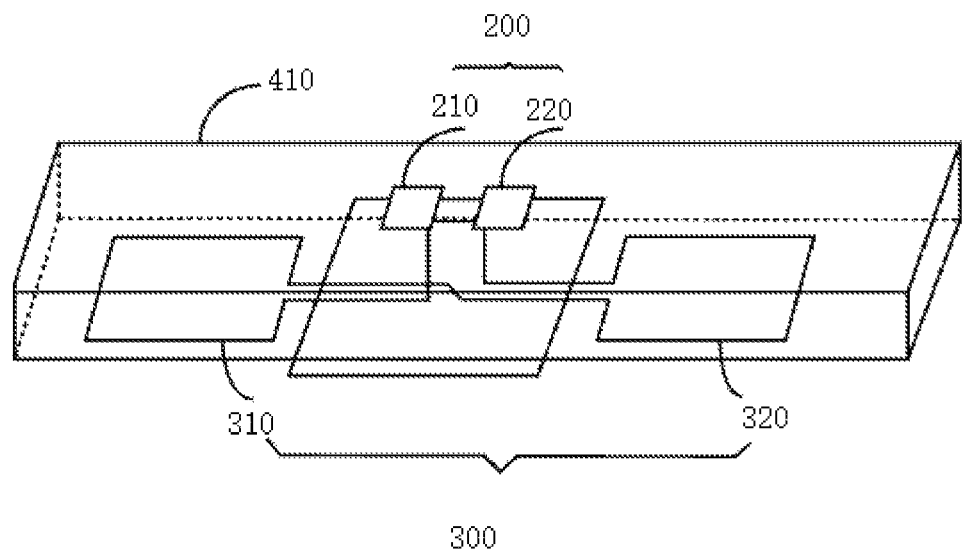
FIG. 3 is a schematic structure diagram illustrating a fault prediction apparatus for a power conversion device according to an embodiment of the present disclosure.

In an embodiment, a fault prediction apparatus for a power conversion device is provided, referring to FIG. 3, which includes a detecting coil 300 and a data processing device. The detecting coil is connected to the data processing device. The detecting coil is a closed coil; and the electromagnetic induction is generated between the detecting coil and the switching-on circuit of the switching transistor in the power conversion device. The data processing device is not shown in the figures.

The data processing device is configured to acquire multiple output voltages of the detecting coil 300 in a preset time period, extract each output frequency corresponding to each output voltage of the detecting coil 300, and predict time when the power conversion device fails according to a change trend of each output frequency.

The detecting coil is a closed coil, and the head and end of the detecting coil are connected to form a loop. The connection can be a direct connection of the head and end of the detecting coil, or an indirect connection between the head and end through both ends of other devices. A shape of the detecting coil can be rectangular, circular, etc.; and a material of the detecting coil can be copper, aluminum, etc.

In this embodiment, the electromagnetic induction is generated between the detecting coil 300 and the switching-on circuit of the switching transistor in the power conversion device, which refers to that when the power conversion device controls the switching-on and switching-off of the switching transistor through the circuit, the current in the switching-on circuit of the switching transistor may change, and the changed current may generate an induced electromotive force in the detecting coil 300. The induced electromotive force generated is the output voltage of the detecting coil.

Further, the data processing device may include a data acquisition module, a data extraction module, and a data analysis module. The data acquisition module is configured to acquire the output voltage of the detecting coil 300 in a preset time period. The data extraction module is configured to extract each output frequency corresponding to each output voltage of the detecting coil 300. The data analysis module is configured to predict the time when the power conversion device fails according to the change trend of the output frequency.

Further, in an embodiment, the step that the data processing device predicts the time when the power conversion device fails according to the change trend of each output frequency may specifically include that the data analysis module predicts the time when the power conversion device fails according to the change law of the difference value between each output frequency and the reference frequency.

Further, in an embodiment, the step that the data processing device extracts each output frequency corresponding to each output voltage of the detecting coil may specifically include that the data extraction module obtains the oscillation period of each output voltage according to each output voltage of the detecting coil, and obtains the frequency of each output voltage according to the oscillation period of each output voltage.

Each module in the above-mentioned data processing device can be implemented in whole or in part by software, hardware and a combination thereof. The above modules can be embedded in the form of hardware or independent of the processor in the computer device, or stored in memory of the computer device in the form of software, so that the processor can call and perform an operation corresponding to each module.

In an embodiment, the detecting coil 300 of the fault prediction apparatus for the power conversion device is symmetrical with respect to the switching-on circuit of the switching transistor to be detected.

Specifically, the detecting coil 300 is symmetrical with respect to the switching-on circuit of the switching transistor to be detected, which refers to that the structures and sizes of the detecting coil 300 on both sides of the switching-on circuit of the switching transistor to be detected are respectively the same. The detecting coil 300 may include two detecting sub-coils with the same structure, namely a first detecting sub-coil 310 and a second detecting sub-coil 320. The two detecting sub-coils are respectively provided on both sides of the switching-on circuit of the switching transistor to be detected. The two detecting sub-coils have the same shape, the same material, the same size, and the same distance from the switching-on circuit of the switching transistor to be detected, to form a symmetrical structure.

At the same time, the two detecting sub-coils are connected to each other, and are connected to an oscilloscope to form a closed loop. Specifically, a first end of the first detecting coil 310 is connected to a first end of the second detecting coil 320; a second end of the first detecting coil 310 is connected to a first probe of the oscilloscope. The first end of the second detecting coil 320 is connected to the first end of the first detecting coil 310, and a second end of the second detecting coil 320 is connected to a second probe of the oscilloscope. The first probe of the oscilloscope can be a positive electrode of the induced voltage; and the second probe of the oscilloscope can be a negative electrode of the induced voltage. The induced voltage generated by the detecting coil 300 is transmitted to the oscilloscope through the probe of the oscilloscope, and the waveform of the induced voltage is displayed on the oscilloscope. Further, the detecting coil 300 is attached to the switching-on circuit of the switching transistor to be detected, to be more sensitive to the current changes in the switching-on circuit.

In this embodiment, by arranging the detecting coil 300 in the symmetrical position with respect to the switching-on circuit of the switching transistor in the power conversion device, so that any current other than that in the switching-on circuit of the switching transistor can generate a magnetic field in parallel with the detecting coil 300, or a magnetic field having an opposite polarity with the detecting coil 300, resulting in that no induced voltage is outputted. At the same time, the magnetic flux generated by the current of the switching-on circuit of the switching transistor in the detecting coil 300 is doubled, which further enhances the induced voltage of the detecting coil 300. Accordingly, the interference of other currents in the power conversion device is reduced, and the accuracy of the output voltage of the fault prediction apparatus for the power conversion device is improved.

In an embodiment, the number of detecting coils 300 of the fault prediction apparatus for the power conversion device is equal to the number of switching transistors to be detected; and each detecting coil 300 detects a corresponding switching transistor to be detected. So that each switching transistor to be detected has a corresponding detecting coil 300 for detection, which is beneficial to improve the accuracy of the results of the fault prediction.

In an embodiment, the number of detecting coils 300 of the fault prediction apparatus for the power conversion device is greater than the number of switching transistors to be detected. Each switching transistor to be detected can be detected by a plurality of detecting coils 300. When some of the detecting coils are damaged and cannot operate normally, the remaining detecting coils can continue to detect the switching transistor to be detected normally, thereby ensuring the accuracy of the fault prediction of the fault prediction apparatus for the power conversion device.

In an embodiment, the number of detecting coils 300 of the fault prediction apparatus for the power conversion device is less than the number of switching transistors to be detected, and the detecting coils 300 are provided for the switching transistors to be detected which require focused monitoring, which can reduce the cost of the fault prediction performed by the fault prediction apparatus for the power conversion device.

In an embodiment, the fault prediction apparatus for the power conversion device includes a package housing 410; the detecting coils 300 are provided within the package housing 410. There are two wiring ports 200 on a surface of the package housing 410, including a first wiring port 210 and a second wiring port 220. The detecting coil 300 is connected to the probe of the oscilloscope through the wiring ports 200. The second end of the first detecting coil 310 is connected to the first probe of the oscilloscope through the first wiring port 210; and the second end of the second detecting coil 320 is connected to the second probe of the oscilloscope through the second wiring port 220. The package housing 410 of the fault prediction apparatus for the power conversion device can reduce the damage to the detecting coils 300; and at the same time, the wiring ports 200 on the surface of the package housing 410 can facilitate the connection between the detecting coils and other devices.

In an embodiment, the detecting coil 300 of the fault prediction apparatus for the power conversion device may be a Rogowski coil. The Rogowski coil is a hollow loop coil, which has the characteristics of a wide detection band, a high precision and a small body size, and is adapted to the measurement of AC current in a wider frequency range, especially the high frequency and large current measurement. When the detecting coil 300 of the fault prediction apparatus for the power conversion device is the Rocgowski coil, the accuracy of the fault prediction can be improved.

The above-mentioned fault prediction apparatus for the power conversion device includes a detecting coil 300 and a data processing device. The detecting coil 300 is connected to the data processing device, the detecting coil 300 is a closed coil, and the electromagnetic induction is generated between the detecting coil 300 and the switching-on circuit of the switching transistor in the power conversion device; the data processing device is configured to acquire the multiple output voltages of the detecting coil 300 in a preset time period, extract each output frequency corresponding to each output voltage of the detecting coil 300, and predict the time when the power conversion device fails according to the change trend of each output frequency.

When the current in the switching-on circuit of the switching transistor in the power conversion device changes, the magnetic flux in the detecting coil 300 also changes, and the changed magnetic flux generates the induced voltage on the detecting coil 300, and a signal of the induced voltage is then transmitted to the data processing device. The data processing device extracts the induction frequency corresponding to each induced voltage according to the received signal of each induced voltage, analyzes the change trend of the induction frequency, and predicts the time when the fault occurs. The fault prediction apparatus for the power conversion device implements the fault prediction of the power conversion device and improves the reliability of the power conversion device.

In an embodiment, a power conversion system is provided, which includes a power conversion device and a fault prediction apparatus for the power conversion device. The power conversion system can be configured to predict the time when the power conversion device fails. The specific steps of predicting the fault include: the fault prediction apparatus for the power conversion device is connected to the power conversion device, the output voltage of the detecting coil 300 is acquired, each output frequency corresponding to each output voltage of the detecting coil 300 is extracted, and time when the power conversion device fails is predicted according to the change trend of each output frequency. Since the current of the switching-on circuit of the switching transistor may change before and after the degradation, each acquired output voltage of the detecting coil 300 is different, and each extracted output frequency is also be different. However, the change trend of the output frequency shows certain characteristics, after the analysis of the data processing device, the time when the fault occurs can be predicted.

In an embodiment, the switching transistor in the power conversion device is a power switching device; the detecting coil 300 is configured to detect a current transient characteristic of the switching transistor; and the electromagnetic induction is generated between the detecting coil 300 and the switching-on circuit of the switching transistor, and the induced voltage is generated accordingly.

For the above power conversion system, firstly, the fault prediction apparatus for the power conversion device is connected to the power conversion device, and then the output voltage of the detecting coil 300 is acquired, and each output frequency corresponding to each output voltage of the detecting coil 300 is extracted; the time when the power conversion device fails is predicted according to the change trend of each output frequency. The system can predict the fault of the power conversion device.

In order to better understand the above embodiments, a detailed explanation is described below in conjunction with a specific embodiment.

Figure 4:
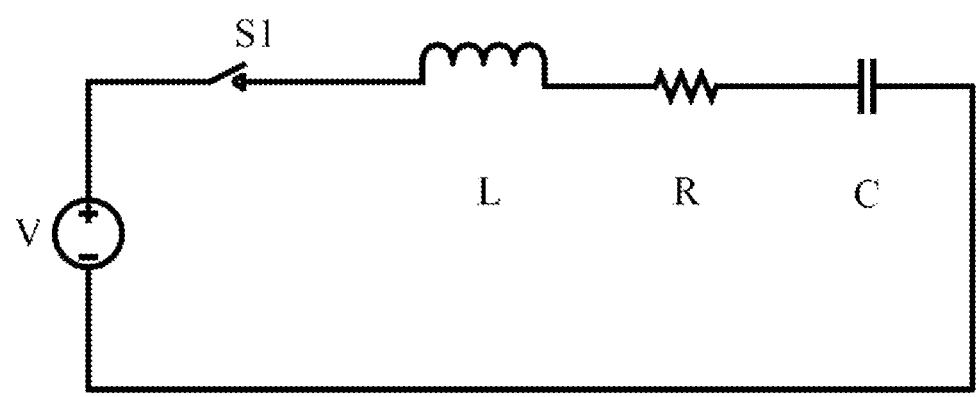
FIG. 4 is an equivalent circuit diagram at a switching moment of a switching transistor of a power conversion device according to an embodiment of the present disclosure.
Figure 5:
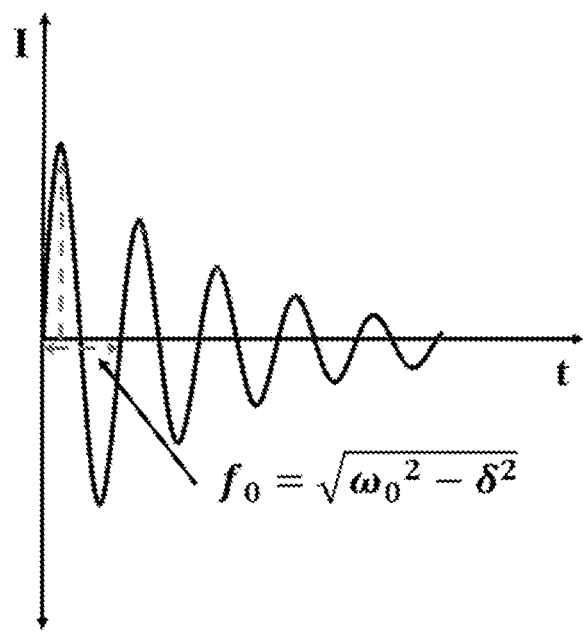
FIG. 5 is an instantaneous waveform diagram of a switching current in a switching transistor of a power conversion device according to an embodiment of the present disclosure.
Figure 6:
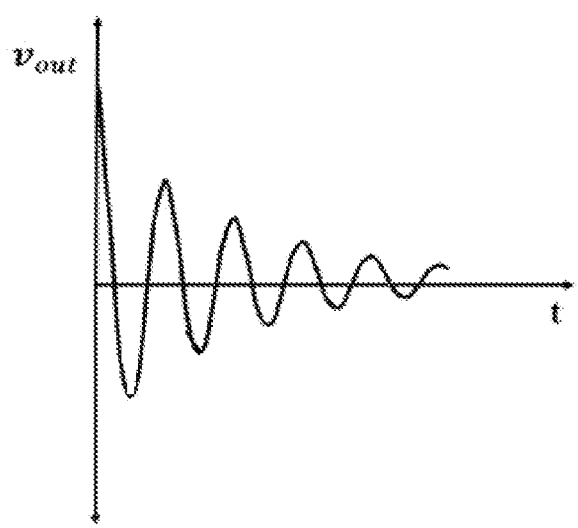
FIG. 6 is a schematic diagram of an induced voltage waveform of a fault prediction apparatus for a power conversion device according to an embodiment of the present disclosure.

In an embodiment, the fault prediction apparatus for the power conversion device includes a detecting coil and a data processing device. The detecting coil 300 is a symmetrical Rogowski coil. The switching transient circuit of the switching transistor of the power conversion device can be equivalent to an RLC second-order circuit, as shown in FIG. 4. During the switching on and switching off of the switching transistor, the switching-on circuit can generate a transient oscillation current. The waveform of the oscillation current is shown in FIG. 5. The Rogowski coil can induce the transient oscillation current and generate the induced voltage in direct proportion to the inverse of the transient oscillation current, the waveform diagram of the induced voltage is shown in FIG. 6; and the oscillation frequency of the induced voltage of the Rogowski coil is the same as the oscillation frequency of the transient oscillation current. When the switching-on circuit of the switching transistor is located in a symmetric position under the Rogowski coil, any current through other traces, via holes and bonding pad on the circuit board can be decomposed into three components in the X, Y and Z directions, respectively. Currents in the X and Y directions generate magnetic fields parallel to the Rogowski coil, resulting in zero coupling and therefore no measurement output. The Z-direction current located outside the package housing 410 generates signals with opposite polarities in two Rogowski coils, which cancel out each other, and accordingly no measurement is outputted. So that the interferences of the currents in other circuits excepting the switching-on circuit can be avoided. The fault prediction apparatus for the power conversion device is directly attached to the circuit of the power conversion device, and there is no need to change the circuit design and layout of the power conversion device.

Power conversion device can be a DC/DC power supply. The DC/DC power supply is a DC converter, which can convert one DC voltage into another fixed or adjustable DC voltage. The DC/DC power supply circuit can be equivalent to an LRC second-order system. In the process of switching on and switching off of the switching transistor, the loop may cause oscillations, and the oscillation frequency is $f_0$ and $f_0 = ((\omega_0)^2 - \xi^2)^{1/2}$, in which $\xi = R/2L$, $\omega_0 = 1/(LC)^{1/2}$. $\xi$ represents a damping coefficient of an attenuation oscillation, $\omega_0$ represents a resonance angular frequency, R represents a resistance, L represents an inductance, and C represents a capacitance. When the switching transistor or other devices in the DC/DC power supply circuit degrade, the oscillation frequency of the current in the loop changes to $f_1$, and the oscillation frequency of the induced voltage in the Rogowski coil also changes to $f_1$. By comparing a normalized oscillation frequency $f_1/f_0$ of the induced voltage before and after the degradation, the degradation trend of the DC/DC power supply can be obtained.

Figure 7:
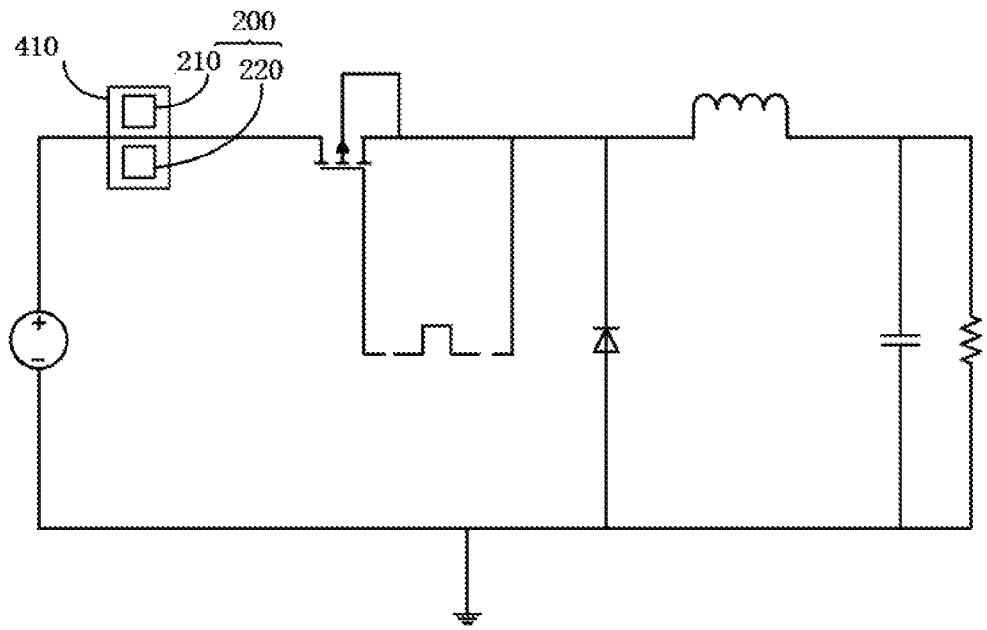
FIG. 7 is a schematic diagram of an arrangement relationship between a fault prediction apparatus for a power conversion device and an on-state circuit according to an embodiment of the present disclosure.

The specific steps for predicting a fault of the DC/DC power supply include: a Rogowski coil is designed, and the Rogowski coil is located directly above the switching-on circuit of the switching transistor, in which components at both ends of the switching-on circuit are spaced to allow an insertion of a fault prediction apparatus for a power conversion device; or the Rogowski coil is embedded and designed in the circuit board. The fault prediction apparatus for the power conversion device is arranged perpendicular to the switching-on circuit of the switching transistor, specifically the Rogowski coil is arranged perpendicular to the switching-on circuit of the switching transistor, as shown in FIG. 7. FIG. 7 is a top view of the fault prediction apparatus for the power conversion device; the wiring port 200 can be seen from the outside of the package housing 410; and the detecting coil 300 is located within the package housing 410 but cannot be seen from the outside of the package housing 410. Then the induced voltage of the Rogowski coil is acquired, and then the corresponding oscillation frequency is extracted according to the waveform of the induced voltage to obtain the degradation trend of the DC/DC power supply and predict the time when the fault occurs. Through the above process, the fault prediction of the DC/DC power supply can be implemented and the operation reliability of the DC/DC power supply can be further improved.

Power conversion device can also be a DC/AC inverter. The DC/AC inverter is a device that can convert a DC voltage or current into an AC voltage or current. The DC/AC inverter can be equivalent to the LRC second-order system. In the process of switching on and switching off of the switching transistor, the loop may cause oscillations, and the oscillation frequency is $f_0$ and $f_0 = (\omega_0)^2 - \xi^2)^{1/2}$, in which $\xi = R/2L$, $\omega_0 = 1/(LC)^{1/2}$. $\xi$ represents a damping coefficient of an attenuation oscillation, $\omega_0$ represents a resonance angular frequency, R represents a resistance, L represents an inductance, and C represents a capacitance. When the switching transistor or other devices in the DC/AC inverter degrade, the oscillation frequency of the current in the loop changes to $f_1$, and the oscillation frequency of the induced voltage in the Rogowski coil also changes to $f_1$. By comparing a normalized oscillation frequency $f_1/f_0$ of the induced voltage before and after the degradation, the degradation trend of the DC/AC inverter can be obtained.

Figure 8:
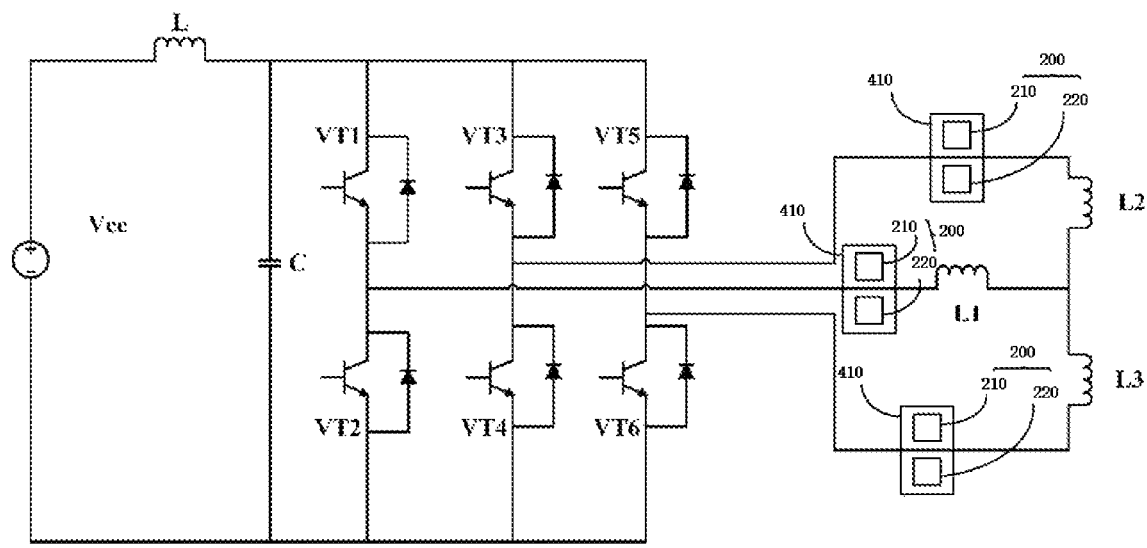
FIG. 8 is a schematic diagram of an arrangement relationship between a fault prediction apparatus for a power conversion device and an on-state circuit according to another embodiment of the present disclosure.

The specific steps for predicting a fault of the DC/AC inverter include: a Rogowski coil is designed, and the Rogowski coil is located directly above the switching-on circuit of the switching transistor, in which components at both ends of the switching-on circuit are spaced to allow an insertion of a fault prediction apparatus for a power conversion device; or the Rogowski coil is embedded and designed in the circuit board. The fault prediction apparatus for the power conversion device is arranged perpendicular to the switching-on circuit of the switching transistor, specifically the Rogowski coil is arranged perpendicular to the switching-on circuit of the switching transistor, as shown in FIG. 8. FIG. 8 is a top view of the fault prediction apparatus for the power conversion device; the wiring port 200 can be seen from the outside of the package housing 410; and the detecting coil 300 is located within the package housing 410 but cannot be seen from the outside of the package housing 410. Then the induced voltage of the Rogowski coil is acquired, and then the corresponding oscillation frequency is extracted according to the waveform of the induced voltage to obtain the degradation trend of the DC/AC inverter and predict the time when the fault occurs. Through the above process, the fault prediction of the DC/AC inverter can be implemented and the operation reliability of the DC/AC inverter can be further improved.

The limitations in the above embodiments can be arbitrarily combined. In order to make the description concise, all possible combinations of the limitations in the above embodiments are not described. However, as long as there is no contradiction in the combination of these limitations, they should be considered as the scope of the present disclosure.

The embodiments described above are merely some embodiments of the present disclosure, which are described in more specific and detail, but are not thereby understood as limiting the scope of the present disclosure. It should be noted that those skilled in the art can make a number of modifications and improvements without departing from the concept of the present disclosure, which fall within the scope of protection of the present disclosure. Therefore, the scope of protection of the present disclosure should be subject to the attached claims.

What is claimed is:

1. A fault prediction method for a power conversion device, comprising:
   acquiring multiple output voltages of a detecting coil in a preset time period, wherein an electromagnetic induction is generated between the detecting coil and a switching-on circuit of a switching transistor in the power conversion device;
   extracting each output frequency corresponding to each output voltage of the detecting coil;
   predicting time when the power conversion device fails according to a change trend of each output frequency.

2. The fault prediction method for the power conversion device according to claim 1, wherein the predicting the time when the power conversion device fails according to the change trend of each output frequency comprises: predicting the time when the power conversion device fails according to a change law of a difference value between each output frequency and a reference frequency.

3. The fault prediction method for the power conversion device according to claim 1, wherein the extracting each output frequency corresponding to each output voltage of the detecting coil comprises:
   obtaining an oscillation period of each output voltage according to each output voltage of the detecting coil;
   obtaining a frequency of each output voltage according to the oscillation period of each output voltage.

4. A fault prediction apparatus for a power conversion device, comprising a detecting coil and a data processing device, wherein the detecting coil is connected to the data processing device, the detecting coil is a closed coil, and an electromagnetic induction is generated between the detecting coil and a switching-on circuit of a switching transistor in the power conversion device;
   wherein the data processing device is configured to:
     acquire multiple output voltages of the detecting coil in a preset time period, extract each output frequency corresponding to each output voltage of the detecting coil, and predict time when the power conversion device fails according to a change trend of each output frequency.

5. The fault prediction apparatus for the power conversion device according to claim 4, wherein the detecting coil is symmetric with respect to the switching-on circuit of the switching transistor to be detected.

6. The fault prediction apparatus for the power conversion device according to claim 4, wherein the number of detecting coils is equal to the number of switching transistors to be detected, and each detecting coil is configured to detect a corresponding switching transistor to be detected.

7. The fault prediction apparatus for the power conversion device according to claim 4, further comprising a package housing, wherein the detecting coil is provided within the package housing.

8. The fault prediction apparatus for the power conversion device according to claim 4, wherein the detecting coil is a Rogowski coil.

9. A power conversion system, comprising a power conversion device, and the fault prediction apparatus for the power conversion device of claim 4.

10. The power conversion system according to claim 9, wherein the switching transistor in the power conversion device is a power switching device, the detecting coil is configured to detect a current transient characteristic of the switching transistor, and an electromagnetic induction is generated between the detecting coil and the switching-on circuit of the switching transistor, and an induced voltage is generated.

* * * * *